US011088049B2

(12) United States Patent
Abshere

(10) Patent No.: US 11,088,049 B2
(45) Date of Patent: Aug. 10, 2021

(54) HEAT SINK FORMED FROM A HIGH PIPE DENSITY SILICON CARBIDE SUBSTRATE

(71) Applicant: NLIGHT, INC., Vancouver, WA (US)

(72) Inventor: Travis Arthur Abshere, Portland, OR (US)

(73) Assignee: NLIGHT INC., Vancouver, WA (US)

( * ) Notice: Subject to any disclaimer, the term of this patent is extended or adjusted under 35 U.S.C. 154(b) by 0 days.

(21) Appl. No.: 16/653,695

(22) Filed: Oct. 15, 2019

(65) Prior Publication Data

US 2020/0126885 A1 Apr. 23, 2020

Related U.S. Application Data

(60) Provisional application No. 62/749,538, filed on Oct. 23, 2018.

(51) Int. Cl.
*H01L 23/373* (2006.01)
*C04B 35/565* (2006.01)
*H01S 5/024* (2006.01)

(52) U.S. Cl.
CPC ........ *H01L 23/3731* (2013.01); *C04B 35/565* (2013.01); *H01S 5/02476* (2013.01)

(58) Field of Classification Search
CPC ............. H01L 23/3731; H01L 23/3733; H01L 23/3738; H01S 5/02476; H01S 5/02469; H01S 5/02276; C04B 35/565; C04B 35/56; C04B 35/5607
See application file for complete search history.

(56) References Cited

U.S. PATENT DOCUMENTS

| 4,698,663 | A  | * | 10/1987 | Sugimoto | ............. H01L 23/055 257/713 |
| 6,448,581 | B1 |   | 9/2002  | Warwick  |   |
| 7,175,704 | B2 |   | 2/2007  | D'Evelyn |   |
| 7,412,135 | B2 | * | 8/2008  | Seifert   | ................. G02B 6/2856 385/127 |
| 9,203,213 | B2 | * | 12/2015 | Yamanaka | ............ H01S 5/0208 |

(Continued)

OTHER PUBLICATIONS

Gautier et al., "Investigation of direct current electrical properties of electrochemically etched mesoporous silicon carbide", 2014, Journal of Applied Physics 116, 223705-01-223705-06, published Dec. 11, 2014 (Year: 2014).*

(Continued)

*Primary Examiner* — Nikolay K Yushin
(74) *Attorney, Agent, or Firm* — Schwabe Williamson & Wyatt

(57) ABSTRACT

Some embodiments may include a porous silicon carbide substrate plugged with dielectric material, the porous silicon carbide substrate including a first side to couple to a heat source and a second side to couple to an electrically conductive surface, wherein the second side is opposite the first side; wherein in the case that an opening on the area of the first side forms a channel with an opening on an area of the second side, a portion of the dielectric material located in the channel is arranged to prevent an electrical short from forming through the porous silicon carbide substrate to the electrically conductive surface. In some examples, the heat source may be one or more semiconductor laser diode chips. Other embodiments may be disclosed and/or claimed.

18 Claims, 8 Drawing Sheets

(56) References Cited

U.S. PATENT DOCUMENTS

2006/0251367 A1* 11/2006 Seifert .................. G02B 6/2856
385/123
2015/0023376 A1* 1/2015 Yamanaka ............ H01S 5/0208
372/36

OTHER PUBLICATIONS

Vetter et al., "Characterization of Micropipes and Other Defect Structures in 6H—SiC Through Fluorescence Microscopy", 1996, Mat. Res. Soc. Symp. Proc. vol. 406 © 1996 Materials Research Society, pp. 561-566; Dec. 1996. (Year: 1996).*
Neudeck et al., "Performance Limiting Micropipe Defects in Silicon Carbide Wafers", 1994, IEEE Electronic Devices Letters, vol. 15, No. 2, pp. 63-65 (Year: 1994).*

* cited by examiner

HEAT SINK FORMED FROM A HIGH PIPE DENSITY SILICON CARBIDE SUBSTRATE

RELATED APPLICATIONS

This application is a non-provisional of and claims priority benefit to U.S. provisional application Ser. No. 62/749,538, filed Oct. 23, 2018, which is incorporated by reference herein in its entirety.

TECHNICAL FIELD

The present disclosure relates to a heat sink formed from a high pipe density silicon carbide substrate, and some embodiments the heat sink may be used as a thermal submount for a chip on submount (CoS) in a laser diode system.

BACKGROUND

Fiber lasers are widely used in industrial processes (e.g., cutting, welding, cladding, heat treatment, etc.) In some fiber lasers, the optical gain medium includes one or more active optical fibers with cores doped with rare-earth element(s). The rare-earth element(s) may be optically excited ("pumped") with light from one or more semiconductor laser sources.

In some fiber laser systems, the semiconductor laser sources include integrated circuit (IC) devices (e.g., laser diode chips) mounted on thermal submounts (e.g., a metal-coated ceramic heat sinks). These chip on submount (CoS) packages may be mounted on a heat exchanger, such as a liquid-cooled cooling plate in order to address the thermal dissipation requirements of some laser systems.

As the performance of laser systems continue to advance, the thermal dissipation requirements may also increase. While the heat exchanger may be improved to address these increases in thermal dissipation requirements, the thermal submount may operate as a "bottleneck" for desired increase of thermal dissipation. In particular, the heat exchanger may operate by removing heat delivered to it through the thermal submount. Existing thermal submounts (e.g., metal-coated ceramic heat sinks) may not have adequate performance and/or may be too expensive based on the power level requirements of some fiber laser systems.

BRIEF DRAWINGS DESCRIPTION

The accompanying drawings, wherein like reference numerals represent like elements, are incorporated in and constitute a part of this specification and, together with the description, explain the advantages and principles of the presently disclosed technology.

DETAILED DESCRIPTION

Figure 1:
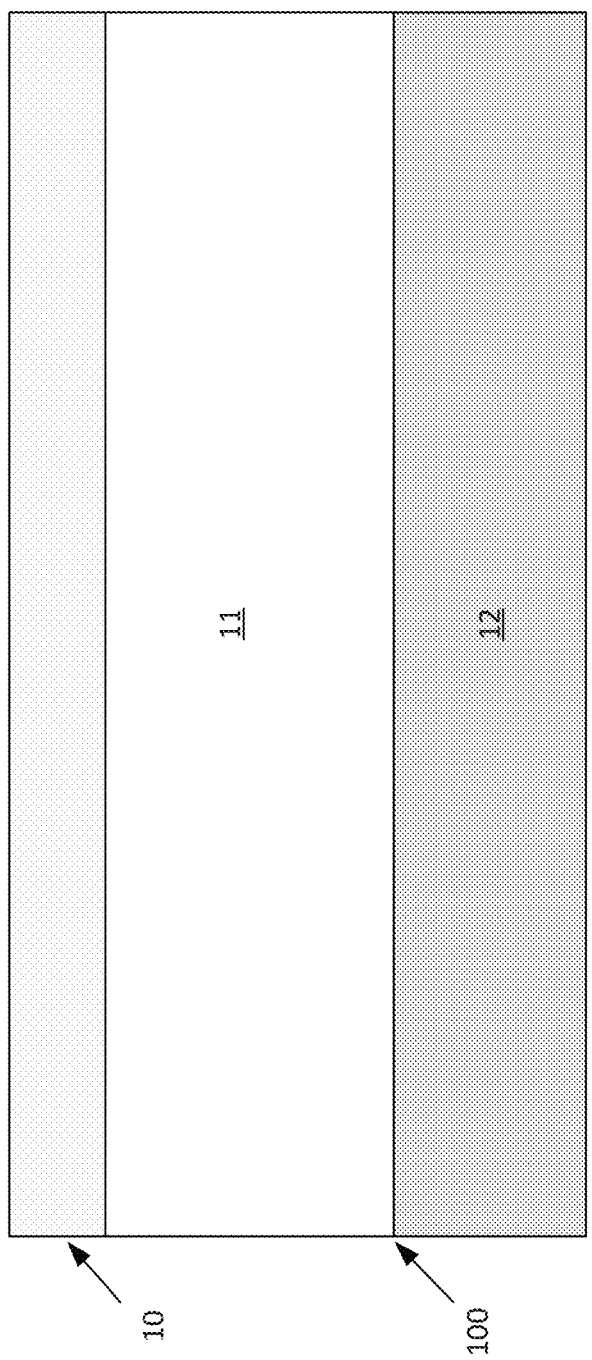
FIG. 1 illustrates an IC device mounted on a heat sink formed from a high pipe density silicon carbide substrate, according to some embodiments.

Some embodiments may include a heat sink formed from porous silicon carbide substrate plugged with dielectric material. In some embodiments, an apparatus including the heat sink may include an IC (integrated circuit) device coupled to an area of a first side of the porous silicon carbide substrate; metal coupled to an area of a second side of the porous silicon carbide substrate, wherein the second side is opposite the first side; wherein in the case that an opening on the area of the first side forms a channel with an opening on an area of the second side, a portion of the dielectric material located in the channel is arranged to prevent the IC device from electrically shorting to the metal. Other embodiments may be disclosed and/or claimed.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. The systems, apparatus, and methods described herein should not be construed as limiting in any way. Instead, the present disclosure is directed toward all novel and non-obvious features and aspects of the various disclosed embodiments, alone and in various combinations and sub-combinations with one another.

The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation. Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus.

Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art. In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

In some thermal submounts for fiber laser systems, a CoS package includes one or more laser diode chips (e.g., twelve or more, in some cases) mounted on a thermal submount. The thermal submount may include a diamond substrate (or some other dielectric material with good thermal conductivity, such as a ceramic, e.g., AlN) on a layer of metal (with the diamond substrate or other dielectric material "sandwiched" by the layer of metal and a metal pad of the laser diode chip). While the diamond substrate may provide an adequate heat path due to its high thermal conductivity, and also may desirably electrically isolate the metal pad from the layer of metal, diamond has a coefficient of thermal expansion that is not closely matched with the coefficient(s) of thermal expansion of the material(s) of the metal. This mismatch of coefficients of thermal expansion may lead to physical stress on the laser diode chip at high temperatures (due to the diamond layer not "stretching" with the die during thermal cycling).

Silicon carbide, like diamond, has adequate thermal transfer characteristics (e.g., comparable to coppper), but unlike diamond has a coefficient of thermal expansion more closely matched to the coefficient of thermal expansion of the materials of the die (e.g., gallium arsenide). Therefore, it would be desirable to "sandwich" a silicon carbide substrate between the die and the metal layer similar to how a diamond substrate is used. However, unlike diamond substrates, during fabrication of a silicon carbide substrate a defect called a "micropipe" (also referred to herein as pipe) may form in a surface of the substrate. Low pipe density silicon carbide substrate can be fabricated (high volume silicon carbide wafer production may be focused on EPI ready wafer production). EPI ready indicates a surface with less than threshold defects ready for epitaxial growth of additional layers.

In low pipe density silicon carbide (e.g., EPI ready silicon carbide substrate), these pipes may be smaller in diameter than a threshold (low diameter) and few in number for a given area (low pipe density). In low pipe density silicon carbide substrates, there may be a low probability of at least one pipe extending from one side of the substrate to the other side (for the given thickness). So long as the pipes do not extend from one side of the substrate to the other side of the substrate, both sides of the substrate may be metalized (e.g., in order to make soldering contacts on both sides) without creating an electrical pathway that connects one side of the substrate to the other (an electrical pathway can form during production, or after production in operation based on reflow caused by high temperatures). For instance, even if metallization leaves metal in the pipes (the metal may be deposited into the pipes, or may travel into the pipes by electro migration), so long as the pipes do not extend completely through the substrate one side of the substrate may still be electrically isolated from the other side of the substrate. While low pipe density silicon carbide substrate may have characteristics that would be desirable for use in a metal-coated ceramic heat sink, low pipe density silicon carbide substrate may be significantly more expensive than high pipe density silicon carbide substrate.

High pipe density silicon carbide substrate may be salvaged for use in EPI applications by forming an additional layer of silicon carbide on the surface of a slice (e.g., in which the additional layer is used to form an active device layer, say, a gate layer on the silicon carbide). While adding this additional layer of silicon carbide to the surface may significantly reduce the probability of a pipe extending from one side to the other, it may come with tradeoffs including thickening the silicon carbide substrate and/or cause a degradation of the silicon carbide substrate (due to the high temperature and/or high pressure environment needed to add the additional layer of silicon carbide on the surface). It might also be possible to manufacture a thick substrate in the first place (e.g., thicker than diamond substrates used in some fiber laser systems) to provide less than a threshold probability of a pipe extending from one side to the other.

Thick metal-coated ceramic heat sinks are not desirable for some applications, however. For instance, in a fiber laser system, use of thick high thermal conductivity and electrically isolating substrate in a CoS package mounted on a heat exchanger may space the laser diode chip greater than a threshold distance away from a fluid of the heat exchanger (e.g., the cooling plate). Such spacing may limit heat dissipation to a value that does not meet the requirements of some high power fiber laser systems.

Some embodiments described herein may utilize a thin slice of high pipe density silicon carbide substrate in which the pipes are plugged with a dielectric material prior to the metallization. The dielectric material need not completely fill all the pipes—all that may be needed is to prevent formation of electrical pathways between one side of the substrate to the other. Therefore, high pressure and/or temperature environments may not be needed during plugging, which may reduce cost of production and avoid degradation of the thin silicon carbide substrate.

In contrast to some epitaxial approaches that cover the pipes with the same material as the substrate (e.g., SiC (silicon carbide)), which may increase the thickness of the silicon carbide substrate and/or degrade the quality of the silicon carbide substrate, some embodiments may plug the pipes with a different material such as AlN, $Al_2O_3$, silicon oxide, silicon nitride, thermal epoxy, thermally conductive adhesives, or the like, or combinations thereof. Insertion of the plug material into some or all of the micropipes may involve one or more of the following:

Use a sputter or evaporator tool with the SiC wafer under vacuum (e.g., in a vacuum chamber) to deposit electrically isolating material (e.g., AlN, $Al_2O_3$, silicon oxide, silicon nitride, etc.) on the silicon carbide substrate and into the micropipes. This may partially fill or entirely fill the micropipes. Grinding, lapping, etching, or polishing (e.g., chemical-mechanical planarization) the surface may be used to remove the surface material but leave the isolating material in the micropipes.

Use chemical vapor deposition (CVD) and/or plasma CVD to deposit an electrically isolating film under vacuum, coating the surface and depositing into the micropipes. This may partially fill or entirely fill the micropipes. Grinding, lapping, etching, or polishing (e.g., chemical-mechanical planarization) the surface may be used to remove the surface material but leave the isolating material in the micropipes.

Coat one or both surfaces of the silicon carbide substrate in a liquid containing electrically isolating material (e.g., thermal epoxy, thermally conductive adhesives, etc.) Allow capillary action to draw the material into the micropipes. Alternatively, use a vacuum on one side of the silicon carbide substrate to selectively pull the liquid into those micropipes that extend through the substrate. This can be completed with or without additives designed to break surface tension or improve wettability of the liquid in the micropipes. As with other approaches described herein, the material on the surface may be removed. This may be accomplished after a curing processing, but also may include cleaning of the surface and curing of the remaining material in the pipes afterward.

In any embodiment described herein, the isolating material to fill some or all of the micropipes (either partially or completely) may be selected based on its ability to withstand subsequent thermal process steps in device fabrication (e.g., fiber laser fabrication), such as bonding the heat sink to other components. In any embodiment described herein, the material may be further selected such that the CTE mismatch (coefficient of thermal expansion mismatch) between the isolating material and the SiC is not so large that temperature cycling damages the isolating material or the SiC heat sink.

The isolating material may be selected to avoid altering or degrading the silicon carbide structure. Also, the isolating material may be selected based on its heat conductivity characteristics because replacing air in the voids with a material having thermal transfer capability greater than air (such as thermal grease) can provide additional/better paths (besides the silicon carbide itself) for heat to travel from the heat source to the heat exchanger. These additional/better heat paths may not have the thermal transfer capability of heat paths through the silicon carbide itself, but they may have better thermal transfer capability than air. For instance, use of thermal grease may not alter or degrade the silicon carbide structure, and may form additional/better heat paths than air. This approach may provide benefit(s) independent of the electrical isolation of the silicon carbide, and is thus applicable not only to embodiments in which the high pipe density silicon carbide substrate is electrically isolating (e.g., insulating or semi-insulating), but also to other embodiments in which a high pipe desnity silicon carbide substrate is not necessarily electrically isolating (e.g., non-insulating).

In contrast to some approaches of healing or closing micropipes in a silicon carbide substrate, some embodiments described herein may not restructure the SiC material and/or add additional epitaxial SiC to the substrate (which may degrade the quality of the SiC and/or thicken the SiC substrate). Instead, some embodiments described herein may fill the micropipes with a different material as needed to prevent surface metallization from intruding into the SiC bulk via the micropipe pathway.

Some embodiments described herein may use SiC as a metal-coated ceramic heat sink material due to its higher thermal conductivity than some other heat sink materials in fiber laser systems (such as AlN submounts) and its electrical resistivity (meeting the isolation need of element packaging). SiC pricing may be too high to use low micropipe density material—but pricing is much lower if lower grade (high micropipe density and/or diameter) material is used. Although some AlN submounts may be ~380 um thick, SiC standard thickness may be 350 um or 500 um with significant variation possible for lower grade material. Thinning a "thick" substrate to 380 um or lower (or using a thin substrate) may increase the risk (or be associated with a risk) of micropipes being long enough to short out the submount.

FIG. 1 illustrates an IC device 10 mounted on a heat sink 100 formed from a high pipe density silicon carbide substrate 11 (e.g., a metal-coated ceramic heat sink), according to some embodiments. In various embodiments, the high pipe density silicon carbide substrate 100 may include a porous silicon carbide wafer plugged with a material that may be different than the material of the porous silicon carbide wafer. In some embodiments, the high pipe density silicon carbide substrate 100 may be less than 500 um thick, e.g., thinned to some lower value such as 380 um. The heat sink 100 may also include metal 12 (e.g., a sheet of copper) coupled to a first side of the high pipe density silicon carbide substrate 11 (e.g., soldered). The metal 12 may in turn be bonded (e.g., indium bonded) to a metal surface of a heat exchanger (not shown), such as a cooling plate or other heat exchanger.

The IC device 10 may be coupled (e.g., bonded) to the heat sink 100 at a second opposite side of the high pipe density silicon carbide 11. The IC device 10 may include a metal pad (not shown) in contact with the heat sink 100 and a gallium arsenide or other semiconductor layer (not shown) on the metal pad.

Figure 2A:
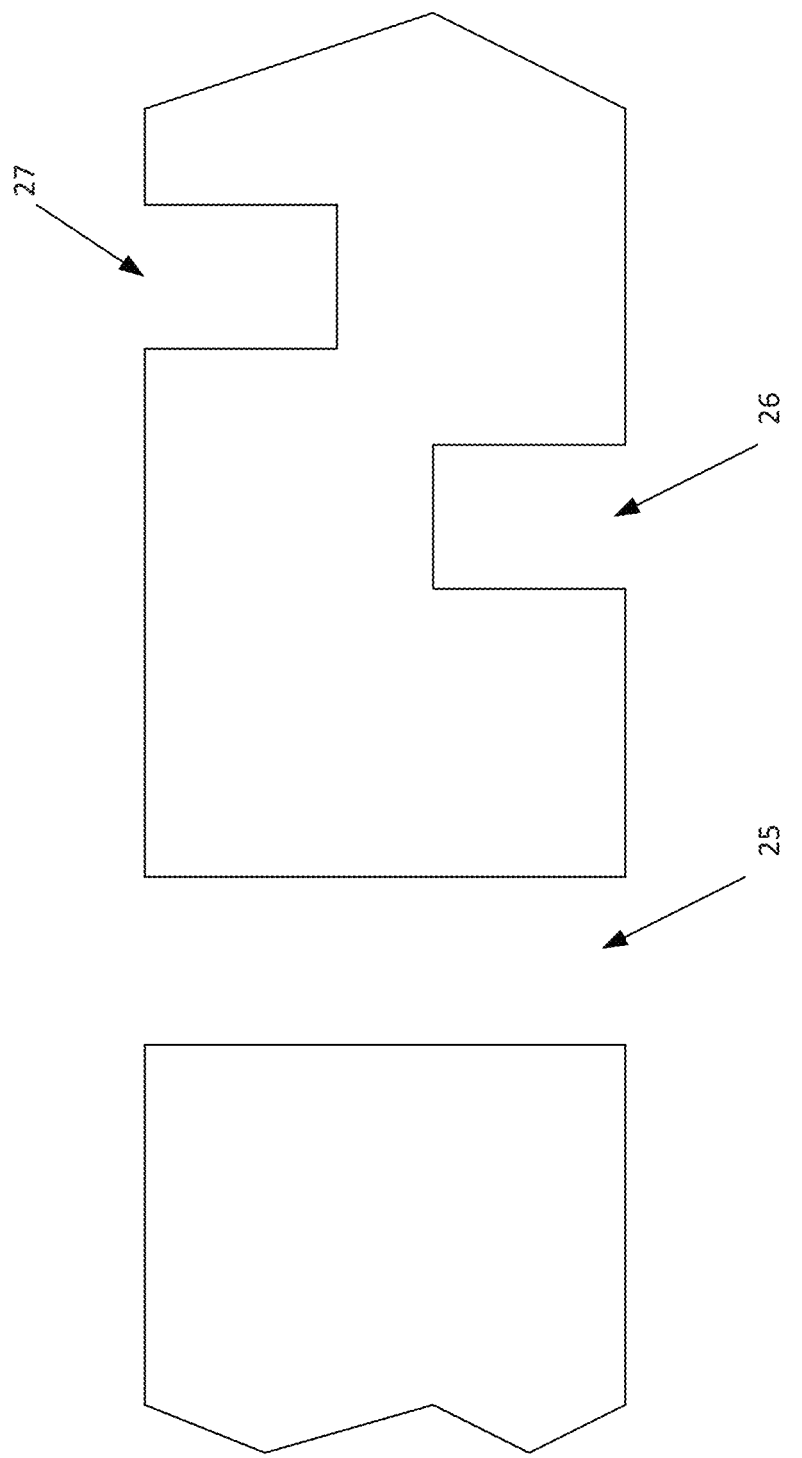
FIG. 2A illustrates a cross sectional view of a porous section of a silicon carbide substrate, in which one of the micropipes extends from one side of the substrate to the other side of the substrate.

FIG. 2A illustrates a cross sectional view of a porous section 21 of a silicon carbide substrate, in which one of the micropipes 25-27 extends from one side of the substrate to the other side of the substrate. The long micropipe 25 has a length at least as long as the thickness of the porous section 21 (the micropipe 25 is illustrated schematically—in an actual structure the micropipe 25 may have a curve and/or be oriented at an angle). The long micropipe extends through the porous section 21 forming a channel that extends from one side of the porous section 21 to the other. The other micropipes 26 and 27 do not form a channel extending through the porous section 21.

Figure 2B:
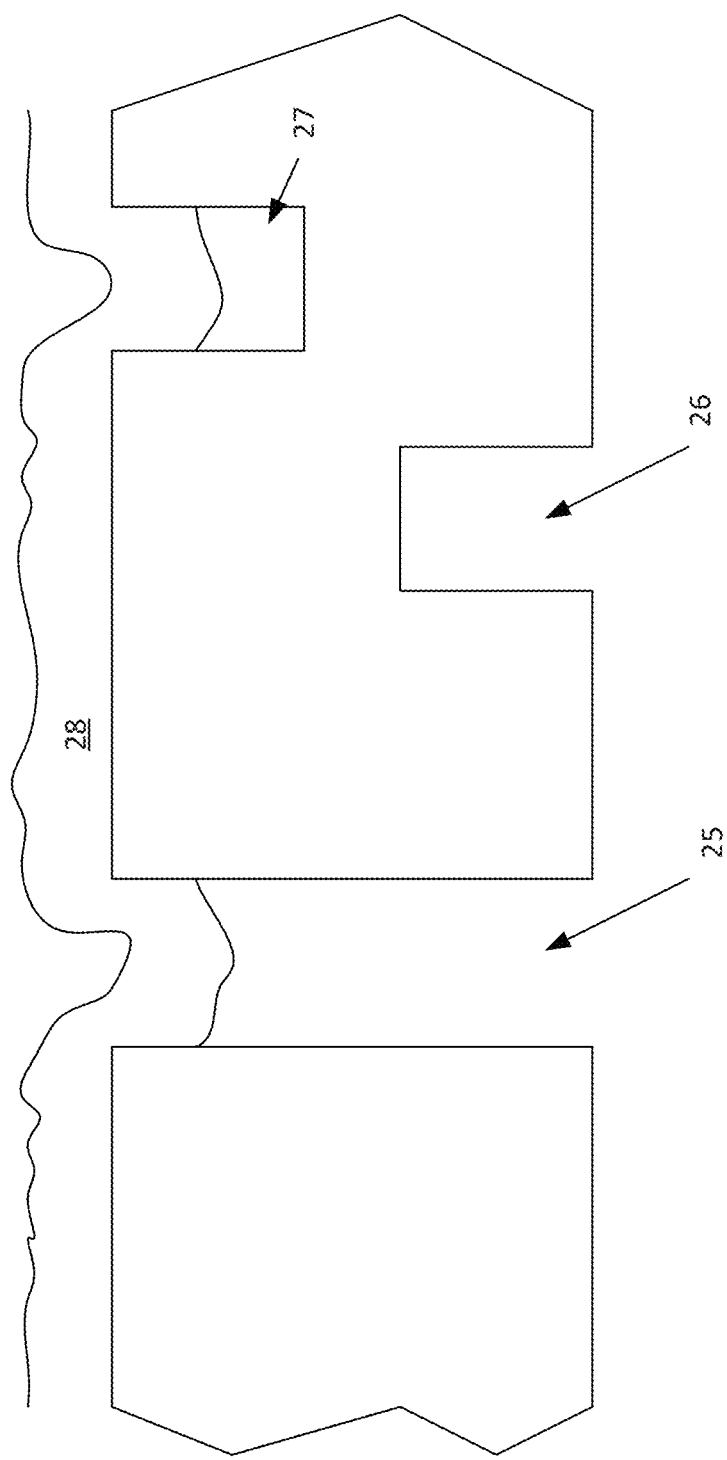
FIG. 2B illustrates a dielectric layer deposited on one side of the porous section of FIG. 2A, according to some embodiments.

FIG. 2B illustrates a dielectric layer 28 deposited on one side of the porous section 21 of FIG. 2A, according to some embodiments. Depositing a dielectric material on at least one side of the porous section 21 may be sufficient to plug any channels such as the micropipe 25. The dielectric layer 28 may extend into the micropipes 27 as well at least partially (depending on its diameter), as illustrated.

Figure 2C:
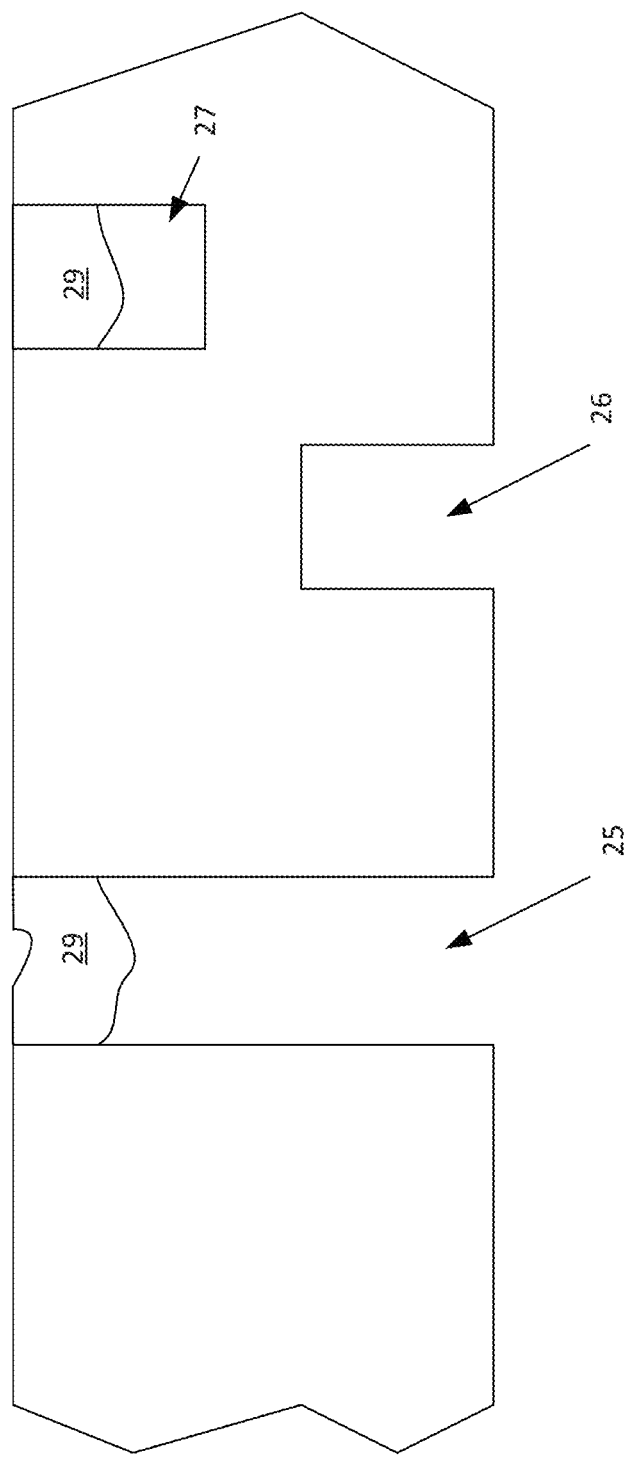
FIG. 2C illustrates the plugged porous section of FIG. 2B, following planarization, according to some embodiments.

FIG. 2C illustrates the plugged porous section 21 of FIG. 2B, following planarization, according to some embodiments. Planarization, such as by polishing, etching, or the like, or combinations thereof, may leave a remainder 29 of the dielectric layer 28 (FIG. 2B) in some of the micropipes 25-27.

The planarized surface including a first side of the remainder 29 may be suitable for a metallization process to form and/or couple a chip to this surface. In the illustrated example, the second opposite side of the remainder 29 may form a void defined by the sidewalls of the micropipes 25 and 27. Air may be located in this void. In other examples, where a similar process may be performed to the other side of the porous section 21 (to plug from both sides, not shown), a remainder (not shown) may be planarized on both sides (the other side of a remainder 29 may be part of a planarized surface suitable for coupling to a sheet of metal and/or a heat exchanger) and may completely fill, say, the micropipe 25, or may define a "keyhole" type void, which may be filled with air.

Figure 2D:
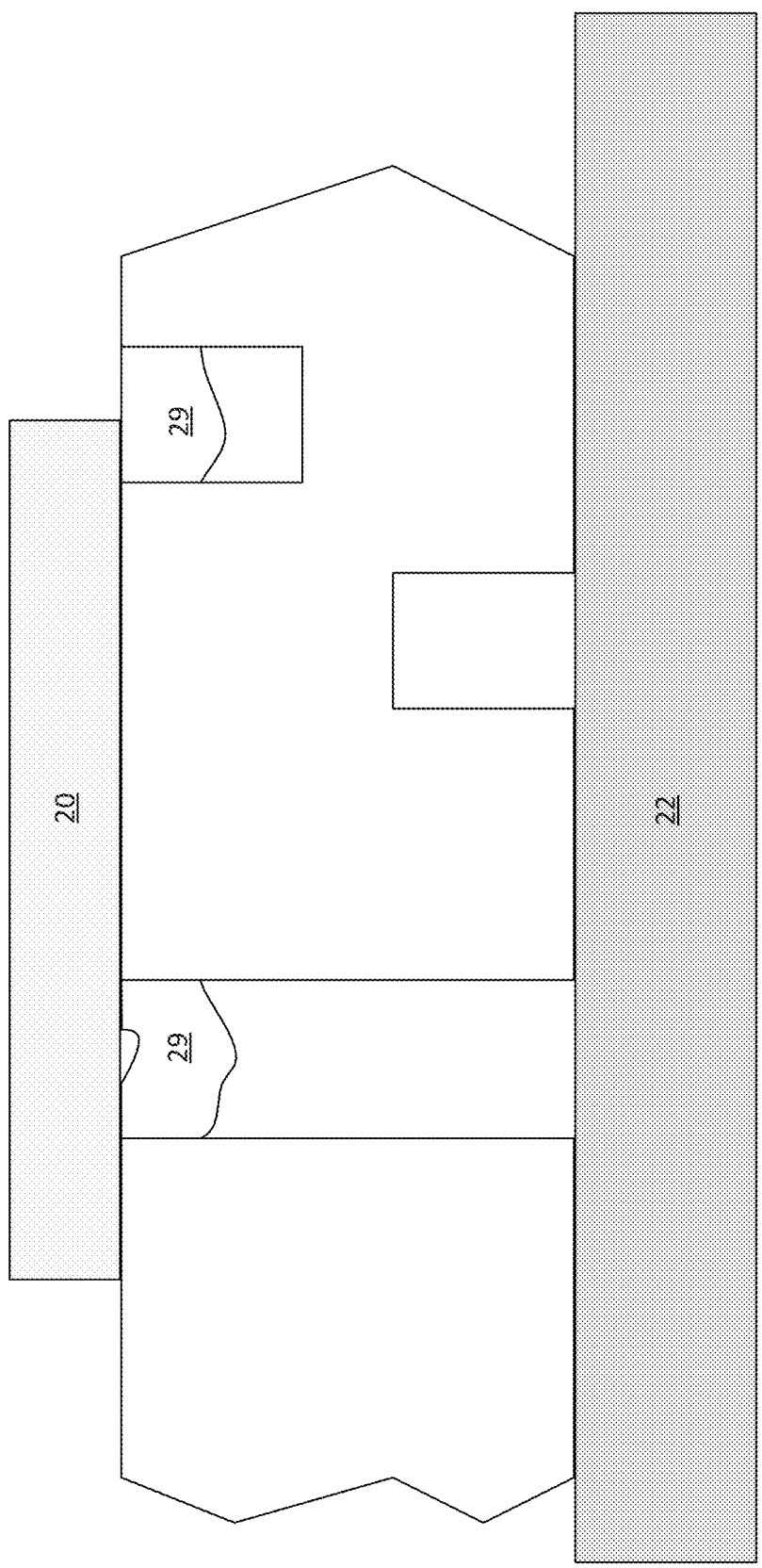
FIG. 2D illustrates a cross sectional view of a heat sink formed from the planarized, plugged porous section of FIG. 2C, according to some embodiments.

FIG. 2D illustrates a cross sectional view of a heat sink formed from the planarized, plugged porous section of FIG. 2C, according to some embodiments. The heat sink may be similar to any heat sink described herein. In particular, the heat sink may include metal 22, which may be similar to metal 12 (FIG. 1), coupled (e.g., bonded) to the planarized plugged porous section. An IC device component, such as metal pad 20, may be formed on the heat sink. Other IC device components formed on the planarized plugged porous section may include an active device layer and a substrate (e.g., gallium arsenide) for the active device layer (not shown). The remainder 29 may prevent metal of the metal pad 20 and/or the metal 22 from shorting the metal pad 20 to the metal 22.

Figure 3:
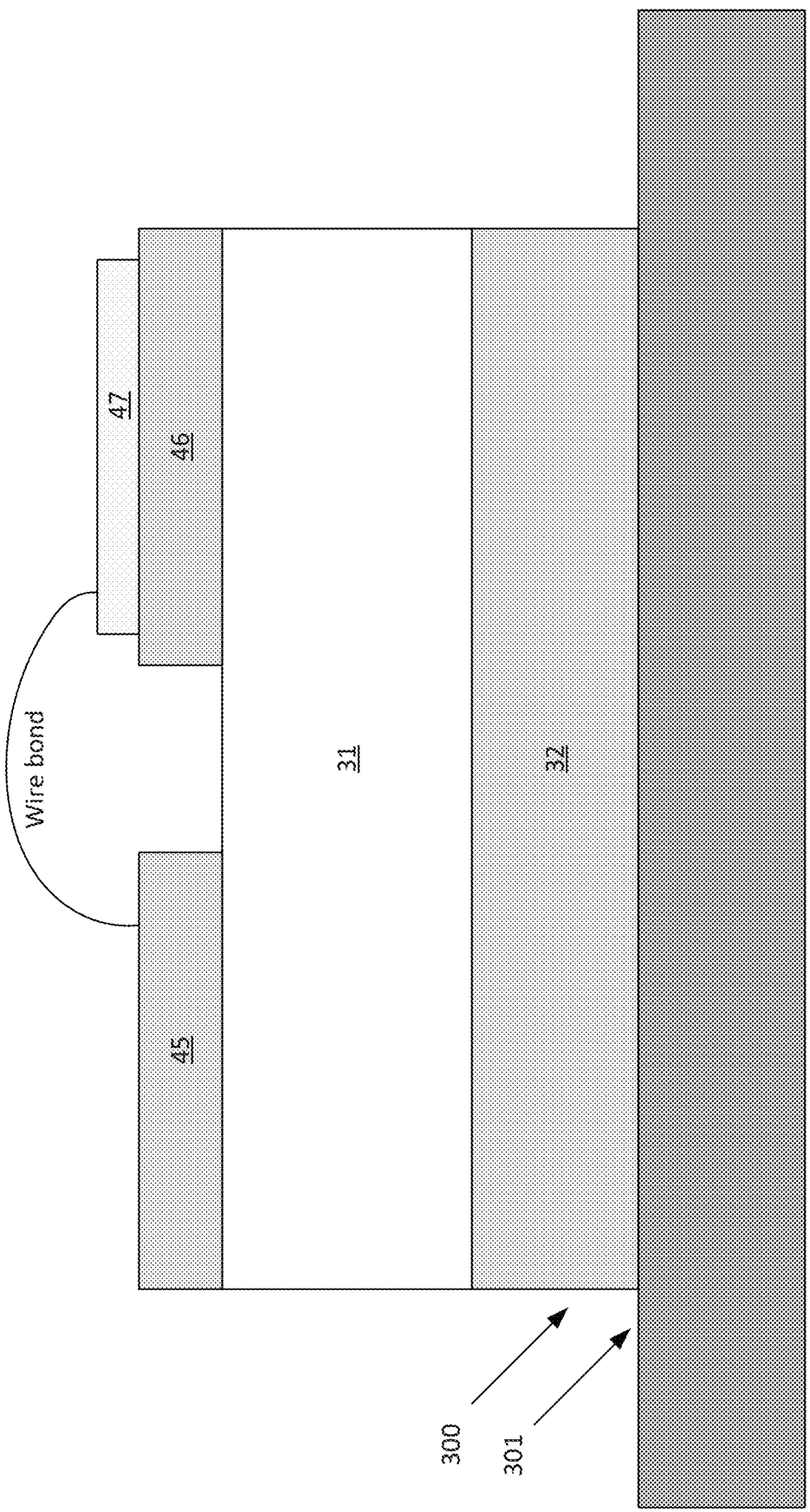
FIG. 3 illustrates a cross section view of a chip on submount (CoS) mounted on a cold plate of a fiber laser system.

FIG. 3 illustrates a cross section view of CoS 300 mounted on a cold plate 301 in a fiber laser system. The CoS 300 may include a chip (e.g., a laser diode chip 47) on a metal pad 46 on a thermal submount formed from a high pipe density silicon carbide substrate 31 (which may be similar to any high pipe density silicon carbide substrate described herein) and metal 32 (which may be similar to metal 12 of FIG. 1).

The metal pad 46 may be electrically isolated from the metal pad 45. The metal pad 45 may be wire bonded to a contact of the laser diode chip 47 (or in other examples, ribbon bonded, direct bonded, or the like, or combinations thereof). The wire may provide a path to supply the laser diode chip 47 with electrons to generate laser light. In the case that the high pipe density silicon carbide substrate 31 includes a channel (not shown) due to a micropipe extending through the substrate 31 and under the metal pads 45 and 46, both metal pads 45 and 46 may be electrically isolated from the metal 32 based on plugs (not shown) formed in the high pipe density silicon carbide substrate 31 (similar to any plugs described herein).

Figure 4:
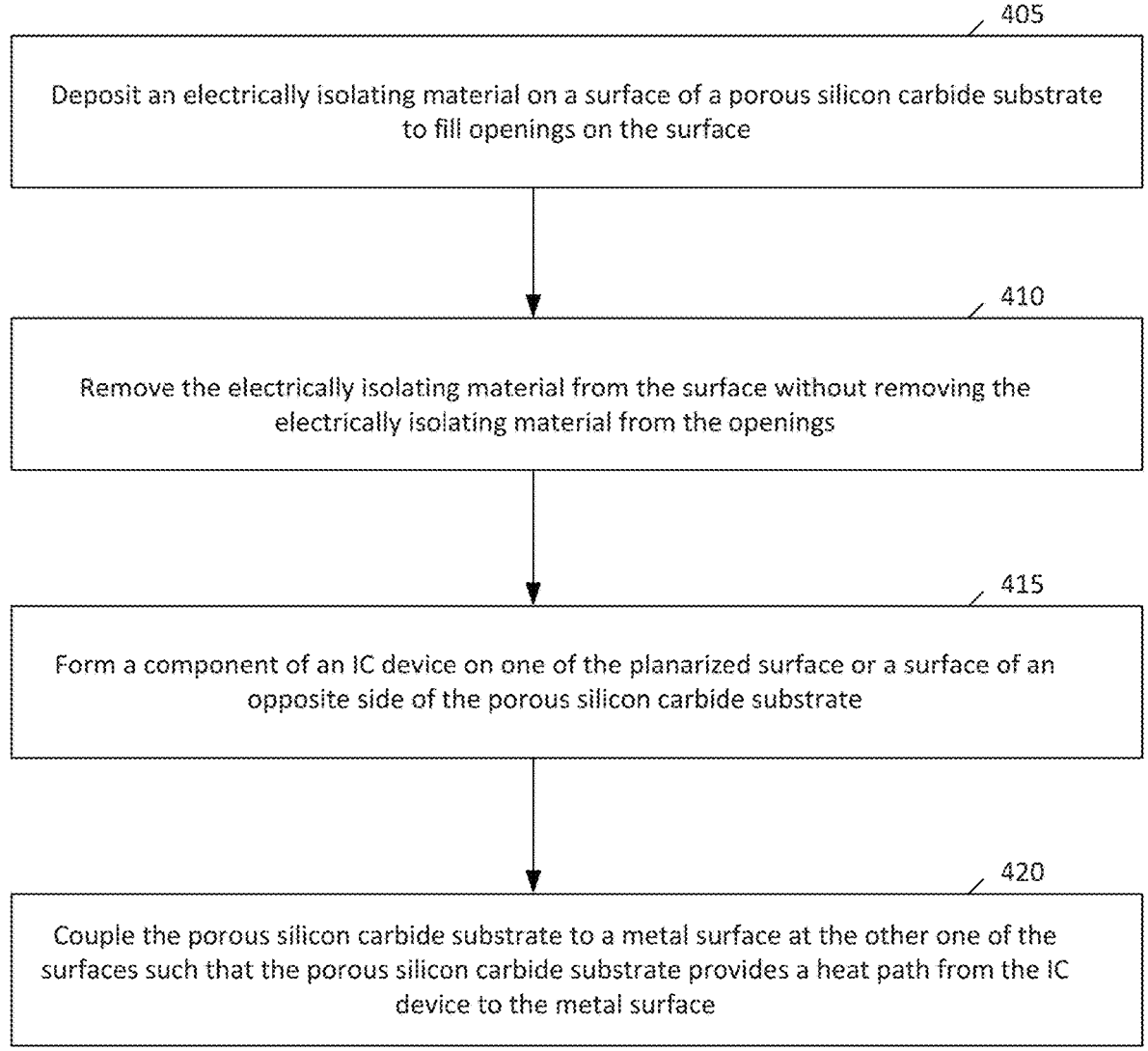
FIG. 4 illustrates a process for fabricating a heat sink from a high pipe density silicon carbide substrate.

FIG. 4 illustrates a process 400 for fabricating a heat sink from a high pipe density silicon carbide substrate. The process 400 may be used to fabricate any heat sink (e.g., thermal submount) described herein.

In block 405, an electrically isolating material may be deposited on a surface of a porous silicon carbide substrate to fill openings on the surface. In some examples, the material may be additionally deposited on a surface of an opposite side of the porous silicon carbide substrate, but this is not required. The material may be different than a material of the porous silicon carbide, and the material may be deposited on the surface without restructuring the material of the porous silicon carbide substrate and/or without degrading the porous silicon carbide substrate.

In one example, the material may include AlN, $Al_2O_3$, silicon oxide, silicon nitride, or the like, or combinations thereof. In another example, the material may include an electrically isolating film deposited under vacuum using CVD and/or plasma CVD.

In block 410, the material may be removed from the surface without removing the material from the openings. In one example, removal may be by grinding, lapping, etching, or polishing, CMP, or the like, or combinations thereof.

In block 415, a component of an IC device may be formed on one of the planarized surface or a surface of an opposite side of the porous silicon carbide substrate. In some examples, the component may be formed by metalizing the surface. The component may be an electrically conductive component, such as one or more metal pads of the IC device, in some examples.

In block 420, the porous silicon carbide substrate may be coupled to a metal surface (or other surface that may have the characteristic of electrical conductivity, as good heat conductors are often electrically conductive too) on one of the surfaces opposite the surface for the IC device such that the porous silicon carbide substrate provides a heat path from the component of the IC device to the metal surface.

Figure 5:
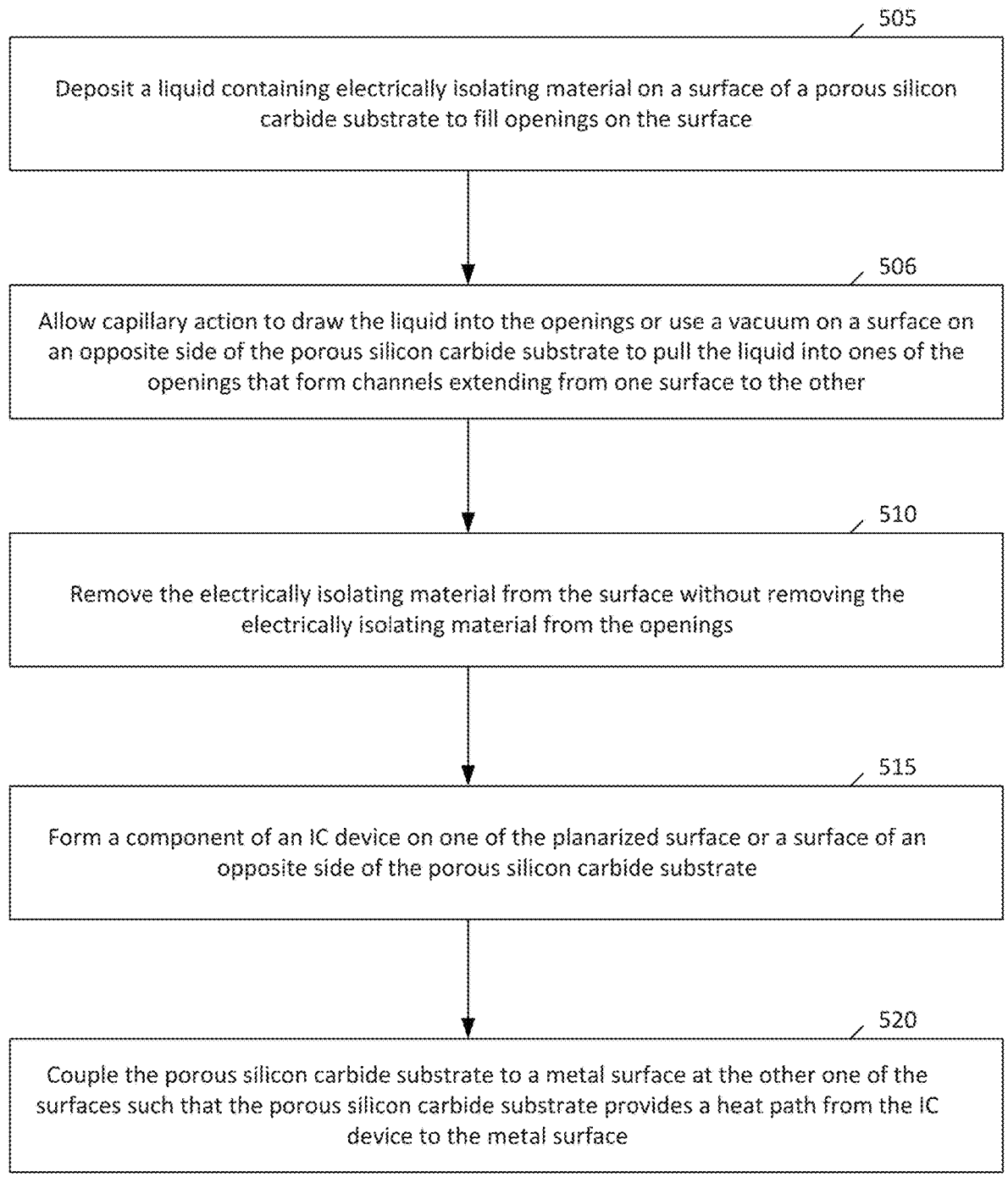
FIG. 5 illustrates another process for fabricating a heat sink from a high pipe density silicon carbide substrate.

FIG. 5 illustrates another process 500 for fabricating a heat sink from a high pipe density silicon carbide substrate. The process 500 may be used to fabricate any heat sink (e.g., thermal submount) described herein.

In block 505, a liquid containing electrically isolating material may be deposited on a surface of a porous silicon carbide substrate to fill openings on the surface. The electrically isolating material may include thermal epoxy, a thermally conductive adhesive, or the like, or combinations thereof. In some examples, the liquid may also include an additive designed to break surface tension and/or improve wettability of the liquid in the micropipes.

In block 506, capillary action may draw the liquid into the openings. In the case of a liquid with a high surface tension, in block 506 a vacuum may be used on a surface on an opposite side of the porous silicon carbide substrate to assist the capillary action (e.g., pull the liquid into ones of the openings that form channels extending from one surface to the other). In some examples, a vacuum chuck and/or a porous chuck may be used (typically vacuum chucks are used to pick up substrates). The vacuum chuck and/or the porous chuck may be briefly turned on to break surface tension and/or pull the liquid partway into the channels (and the vacuum/porous chuck may be turned off at a time selected to prevent the liquid from reaching and/or entering the chuck).

In block 510, the electrically isolating material may be removed from the surface without removing the electrically isolating material from the openings. In some examples, block 510 may include cleaning the surface, and may be performed following a curing period. Once the material is removed from the surface, another curing period may be used to allow the remaining material in the channels to complete curing. Blocks 515 and 520 may be similar to blocks 415 and 420 in any respect (FIG. 4).

Some examples herein may utilize a lowest grade of silicon carbide wafer, which may not be economically viable (or usable at all) for fabrication based on epitaxial growth. This lowest grade silicon carbide wafer may be "binned" as being too low quality for EPI, but with use of the principles described herein that wafer may still be used for fabricating a metal-coated ceramic heatsink for a submount in a fiber laser system or for any other application.

In view of the many possible embodiments to which the principles of the disclosed technology may be applied, it should be recognized that the illustrated embodiments are only preferred examples and should not be taken as limiting the scope of the disclosure. We claim as our invention all that comes within the scope and spirit of the appended claims.

The invention claimed is:

1. An apparatus including a heat sink formed from a porous silicon carbide substrate plugged with dielectric material, the apparatus comprising:
   at least one IC (integrated circuit) device coupled to an area of a first side of the porous silicon carbide substrate;
   metal coupled to an area of a second side of the porous silicon carbide substrate, wherein the second side is opposite the first side; and
   wherein in the case that an opening on the area of the first side forms a channel with an opening on the area of the second side, a portion of the dielectric material located in the channel is arranged to prevent electrical shorting between the opening on the area of the first side and the opening on the area of the second side through the channel;
   wherein the portion of the dielectric material comprises a first side and a second opposite side, and wherein the second opposite side of the portion of the dielectric material, the channel, and the metal form a void.

2. The apparatus of claim 1, wherein the void comprises an air-filled void.

3. The apparatus of claim 1, wherein the dielectric material comprises AlN, Al$_2$O$_3$, silicon oxide, silicon nitride, a thermal epoxy, or a thermally conductive adhesive.

4. The apparatus of claim 1, wherein the porous silicon carbide comprises a thermal submount for a laser diode, and wherein the IC device comprises a laser diode chip.

5. The apparatus of claim 1, wherein the first side of the portion of the dielectric material is planarized.

6. The apparatus of claim 5, wherein at least some of the first side of the portion of the dielectric material is flush against a planar surface coupled to the porous silicon carbide substrate.

7. A metal-coated ceramic heat sink, comprising:
a porous silicon carbide substrate plugged with dielectric material, the porous silicon carbide substrate including a first side to couple to a heat source and a second side to couple to an electrically conductive surface, wherein the second side is opposite the first side;
wherein in the case that an opening on an area of the first side forms a channel with an opening on an area of the second side, a portion of the dielectric material located in the channel is arranged to prevent electrical shorting between the opening on the area of the first side and the opening on the area of the second side through the channel;
wherein the portion of the dielectric material located in the channel includes a thermal epoxy, a thermal grease, or a thermally conductive adhesive.

8. The heat sink claim 7, wherein the portion of the dielectric material only partially fills the channel.

9. The heat sink of claim 7, wherein the portion of the dielectric material comprises a first side and a second opposite side, and wherein the second opposite side of the portion of the dielectric material, the channel, and a planar surface coupled to the porous silicon carbide substrate form a void.

10. The heat sink of claim 9, wherein the void comprises an air-filled void.

11. The heat sink of claim 7, wherein a side of the portion of the dielectric material is planarized.

12. The heat sink of claim 11, wherein the side of the portion of the dielectric material comprises a first side of the portion of the dielectric material, wherein a second opposite side of the portion of the dielectric material is planarized.

13. The heat sink of claim 12, wherein at least some of the second side of the portion of the dielectric material is flush against the electrically conductive surface.

14. A system, comprising:
a fiber laser pumped by one or more semiconductor laser diodes mounted on a thermal submount;
a heat exchanger coupled to the thermal submount, the heat exchanger to remove heat generated by the one or more semiconductor laser diodes from the fiber laser;
wherein the thermal submount comprises:
a porous silicon carbide substrate plugged with dielectric material, wherein at least one of the one or more semiconductor laser diodes are mounted to an area of a first side of the porous silicon carbide substrate;
wherein in the case that an opening on the area of the first side forms a channel with an opening on an area of a second side of the porous silicon carbide substrate, wherein the second side is opposite the first side, a portion of the dielectric material located in the channel is arranged to prevent electrical shorting between the opening on the area of the first side and the opening on the area of the second side through the channel;
wherein the portion of the dielectric material comprises a first side and a second opposite side, and wherein the second side of the portion of the dielectric material, the channel, and a planar surface coupled to the porous silicon carbide substrate form a void.

15. The system of claim 14, wherein the heat exchanger comprises a cooling plate.

16. The system of claim 14, wherein the first side of the portion of the dielectric material is planarized.

17. The system of claim 14, wherein the void comprises an air-filled void.

18. The system of claim 14, wherein the dielectric material comprises AlN, Al$_2$O$_3$, silicon oxide, silicon nitride, a thermal epoxy, or a thermally conductive adhesive.

* * * * *